(12) United States Patent
Cleeves et al.

(10) Patent No.: US 8,766,332 B2
(45) Date of Patent: Jul. 1, 2014

(54) OPTIMIZATION OF CRITICAL DIMENSIONS AND PITCH OF PATTERNED FEATURES IN AND ABOVE A SUBSTRATE

(75) Inventors: James M. Cleeves, Redwood City, CA (US); Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 13/613,956

(22) Filed: Sep. 13, 2012

(65) Prior Publication Data

US 2013/0009230 A1 Jan. 10, 2013

Related U.S. Application Data

(62) Division of application No. 12/136,766, filed on Jun. 10, 2008, now Pat. No. 8,283,706, which is a division of application No. 10/728,437, filed on Dec. 5, 2003, now Pat. No. 7,423,304.

(51) Int. Cl.
*H01L 29/80* (2006.01)

(52) U.S. Cl.
USPC ............... 257/278; 257/204; 257/E27.061

(58) Field of Classification Search
CPC . H01L 27/0688; H01L 27/105; H01L 27/115; H01L 21/8221; H01L 23/528; H01L 27/10894; H01L 27/11568
USPC .................... 257/278, 204, 499, E27.061
See application file for complete search history.

(56) References Cited

U.S. PATENT DOCUMENTS

| | | | |
|---|---|---|---|
| 4,498,226 A | 2/1985 | Inoue et al. | |
| 5,060,045 A | 10/1991 | Owada et al. | |
| 5,266,511 A | 11/1993 | Takao | |
| 5,453,952 A | 9/1995 | Okudaira et al. | |
| 5,587,948 A | 12/1996 | Nakai | |
| 5,621,683 A | 4/1997 | Young | |
| 5,852,310 A | 12/1998 | Kadosh et al. | |
| 5,915,167 A | 6/1999 | Leedy | |
| 6,034,882 A | 3/2000 | Johnson et al. | |
| 6,118,696 A * | 9/2000 | Choi ..................... | 365/185.11 |

(Continued)

FOREIGN PATENT DOCUMENTS

JP 3393923 4/2003

OTHER PUBLICATIONS

S. Wolf et al., Silicon Processing, 2000, Lattice Press, p. 1.

(Continued)

*Primary Examiner* — Kimberly Rizkallah
*Assistant Examiner* — Duy T Nguyen
(74) *Attorney, Agent, or Firm* — Dugan & Dugan, PC

(57) ABSTRACT

A die is formed with different and optimized critical dimensions in different device levels and areas of those device levels using photolithography and etch techniques. One aspect of the invention provides for a memory array formed above a substrate, with driver circuitry formed in the substrate. A level of the memory array consists of, for example, parallel rails and a fan-out region. It is desirable to maximize density of the rails and minimize cost of lithography for the entire memory array. This can be achieved by forming the rails at a tighter pitch than the CMOS circuitry beneath it, allowing cheaper lithography tools to be used when forming the CMOS, and similarly by optimizing lithography and etch techniques for a device level to produce a tight pitch in the rails, and a more relaxed pitch in the less-critical fan-out region.

20 Claims, 13 Drawing Sheets

(56) References Cited

U.S. PATENT DOCUMENTS

| | | | |
|---|---|---|---|
| 6,201,521 | B1 | 3/2001 | Doherty |
| 6,265,778 | B1 | 7/2001 | Tottori |
| 6,373,553 | B1 | 4/2002 | Singh |
| 6,486,066 | B2 | 11/2002 | Cleeves et al. |
| 6,525,953 | B1 | 2/2003 | Johnson |
| 6,555,431 | B1 | 4/2003 | Xing et al. |
| 6,631,085 | B2 | 10/2003 | Kleveland et al. |
| 6,856,572 | B2 | 2/2005 | Scheuerlein et al. |
| 6,879,505 | B2 | 4/2005 | Scheuerlein et al. |
| 6,881,994 | B2 | 4/2005 | Lee et al. |
| 6,940,748 | B2 | 9/2005 | Nejad et al. |
| 6,952,043 | B2 | 10/2005 | Vyvoda et al. |
| 7,005,350 | B2 | 2/2006 | Walker et al. |
| 7,172,840 | B2 | 2/2007 | Chen |
| 7,233,024 | B2 | 6/2007 | Scheuerlein et al. |
| 7,423,304 | B2 | 9/2008 | Cleeves et al. |
| 7,474,000 | B2 | 1/2009 | Scheuerlein et al. |
| 7,505,321 | B2 | 3/2009 | Scheuerlein et al. |
| 7,511,352 | B2 | 3/2009 | Vyvoda |
| 2002/0001965 | A1 | 1/2002 | Forbes |
| 2002/0008270 | A1 | 1/2002 | Marsh |
| 2002/0079520 | A1* | 6/2002 | Nishihara et al. ............ 257/245 |
| 2003/0129815 | A1 | 7/2003 | Doyle et al. |
| 2003/0198101 | A1 | 10/2003 | Pio |
| 2003/0227795 | A1* | 12/2003 | Seyyedy et al. .............. 365/173 |
| 2005/0029619 | A1 | 2/2005 | Forbes |
| 2008/0310231 | A1 | 12/2008 | Cleeves et al. |

OTHER PUBLICATIONS

Supplemental Notice of Allowability of U.S. Appl. No. 10/728,437 mailed Jul. 3, 2008.
Notice of Allowance of U.S. Appl. No. 10/728,437 mailed Jan. 30, 2008.
Final Office Action of U.S. Appl. No. 10/728,437 mailed Jun. 6, 2007.
Office Action of U.S. Appl. No. 10/728,437 mailed Aug. 24, 2006.
Office Action of U.S. Appl. No. 10/728,437 mailed Jan. 25, 2006.
Reply to Jun. 6, 2007 Final Office Action of U.S. Appl. No. 10/728,437.
Reply to Aug. 24, 2006 Office Action of U.S. Appl. No. 10/728,437.
Reply to Jan. 25, 2006 Office Action of U.S. Appl. No. 11/728,437.
Notice of Non-Compliant Amendment of U.S. Appl. No. 10/728,437 mailed Feb. 6, 2007.
Mar. 6, 2007 Reply to Notice of Non-Compliant Amendment of U.S. Appl. No. 10/728,437 mailed Feb. 6, 2007.
Notice of Drawing Inconsistency in Specification of U.S. Appl. No. 11/728,437 mailed Jul. 7, 2008.
Aug. 7, 2008 Reply to Notice of Drawing Inconsistency in Specification of U.S. Appl. No. 11/728,437 mailed Jul. 7, 2008.
Preliminary Amendment of U.S. Appl. No. 12/136,766 mailed Aug. 25, 2008.
Restriction Requirement of U.S. Appl. No. 12/136,766 mailed Jun. 12, 2009.
Jul. 10, 2009 Reply to Restriction Requirement of U.S. Appl. No. 12/136,766 mailed Jun. 12, 2009.
Office Action of U.S. Appl. No. 12/136,766 mailed Aug. 26, 2009.
Nov. 24, 2009 Reply to Office Action of U.S. Appl. No. 12/136,766 mailed Aug. 26, 2009.
Office Action of U.S. Appl. No. 12/136,766 mailed Feb. 16, 2010.
Herner et al., U.S. Appl. No. 10/326,470, filed Dec. 19, 2003.
May 13, 2010 Reply to Feb. 16, 2010 Office Action of U.S. Appl. No. 12/136,766.
Final Office Action of U.S. Appl. No. 12/136,766 mailed Jun. 17, 2010.
Jun. 25, 2010 Reply to Final Office Action of U.S. Appl. No. 12/136,766 mailed Jun. 17, 2010.
Advisory Action of U.S. Appl. No. 12/136,766 mailed Jul. 12, 2010.
Restriction Requirement of U.S. Appl. No. 10/728,437 mailed Sep. 29, 2005.
Oct. 28, 2005 Reply to Restriction Requirement of U.S. Appl. No. 10/728,437 mailed Sep. 29, 2005.
Oct. 5, 2010 Reply to Jul. 12, 2010 Advisory Action and Pre-Appeal Brief Conference Request of U.S. Appl. No. 12/136,766.
Office Action of U.S. Appl. No. 12/136,766 mailed Dec. 30, 2010.
Amendment Submitted with RCE of U.S. Appl. No. 12/136,766, filed Nov. 5, 2010.
Mar. 30, 2011 Reply to Dec. 20, 2010 Office Action of related U.S. Appl. No. 12/136,766.
Final Office Action of U.S. Appl. No. 12/136,766 mailed May 6, 2011.
Examiner's Interview Summary of related U.S. Appl. No. 12/136,766 mailed Jul. 14, 2011.
Aug. 8, 2011 Reply to May 6, 2011 Final Office Action of U.S. Appl. No. 12/136,766.
Office Action of related U.S. Appl. No. 12/136,766 mailed Jan. 24, 2012.
May 7, 2012 Response to Jan. 24, 2012 Office Action of related U.S. Appl. No. 12/136,766.
Applicant-Initiated Interview Summary of related U.S. Appl. No. 12/136,766 May 16, 2012.
Notice of Allowance of related U.S. Appl. No. 12/136,766 Jun. 15, 2012.

* cited by examiner

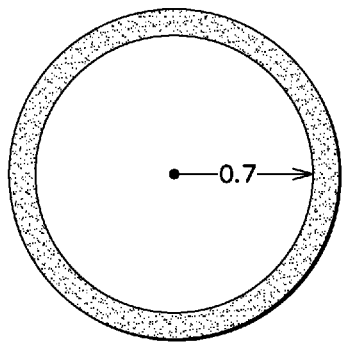
Conventional
FIG. 5A
Annular
Quadrapole
Dipole

OPTIMIZATION OF CRITICAL DIMENSIONS AND PITCH OF PATTERNED FEATURES IN AND ABOVE A SUBSTRATE

REFERENCE TO RELATED APPLICATIONS

This application is a division of U.S. patent application Ser. No. 12/136,766, filed Jun. 10, 2008, now U.S. Pat. No. 8,283,706, which is a division of U.S. patent application Ser. No. 10/728,437, filed Dec. 5, 2003, now U.S. Pat. No. 7,423,304, each of which is hereby incorporated by reference in its entirety.

This application is related to Scheuerlein et al. U.S. patent application Ser. No. 10/728,451, "High Density Contact to Relaxed Geometry Layers," filed on Dec. 5, 2003, which application is hereby incorporated by reference.

BACKGROUND

In traditional circuit layout for a semiconductor die, features are arranged most densely in the substrate and at the same or lower density in subsequent wiring layers formed above the substrate. Pitch (the center-to-center distance between features of an integrated circuit) generally has been relaxed in higher layers due to the difficulty of accurately patterning and etching features over a surface which is not perfectly planar. Topography and deviations from planarity tend to increase in higher layers. Moreover, for simplicity of layout, it is usual to make shorter connections in lower wiring layers, and longer connections in higher wiring layers. As wiring is longer in higher layers, slowing device speed, it has been seen to be advantageous to increase the width and thickness of the wiring to lower its resistance, which has also tended to increase pitch at higher layers.

It has become increasingly important to increase device density, fitting more devices into a smaller substrate area. Increased pitch in higher layers has generally been acceptable, as the device density has been limited by feature density in the substrate, and not by the pitch of above-substrate wiring.

If, however, devices are formed entirely above the substrate, pitch of above-substrate layers becomes more important. Smaller pitch increases lithography costs, however, increasing overall device cost. There is a need, therefore, for above-substrate pitch to be minimized while minimizing overall cost.

SUMMARY

The present invention is defined by the following claims, and nothing in this section should be taken as a limitation on those claims. In general, the invention is directed to a method for optimizing pitch and critical dimensions of features in and above a substrate in semiconductor devices.

A first aspect of the invention provides for a semiconductor die comprising a substrate device level having a substrate pitch, and a first above-substrate device level formed above the substrate device level, the first above-substrate device level having a first above-substrate pitch, wherein the first above-substrate pitch is smaller than the substrate pitch.

A related aspect of the invention provides for a semiconductor die comprising a substrate device level having a substrate pitch, and a first memory level above a substrate having a first memory pitch, wherein the first memory pitch is smaller than the substrate pitch.

Another aspect of the invention provides for a monolithic three dimensional memory array comprising a substrate device level comprising devices formed in a substrate having a first pitch, and a first memory level formed over the substrate device having a second pitch, wherein the second pitch is smaller than the first pitch.

A preferred embodiment of the invention provides for a semiconductor die comprising a first device level formed in a substrate, the first device level having a first pitch, and a first plurality of substantially parallel, substantially coplanar rails formed above the substrate, the first plurality of rails having a second pitch, wherein the first pitch is larger than the second pitch.

An additional aspect of the invention provides for a semiconductor device level comprising a first area comprising a plurality of substantially parallel, substantially coplanar rails, the first plurality of rails having a first pitch, and a second area having a second pitch, wherein the second pitch is larger than the first pitch, wherein photolithographic techniques optimized for forming rails are used to pattern the semiconductor device level.

A preferred embodiment of the invention provides for a semiconductor die comprising a substrate device level having a substrate critical dimension, and a first above-substrate device level formed above the substrate device level, the first above-substrate device level having a first above-substrate critical dimension, wherein the first above-substrate critical dimension is smaller than the substrate critical dimension.

Each of the aspects and embodiments of the invention can be used alone or in combination with one another.

The preferred embodiments will now be described with reference to the attached drawings.

BRIEF DESCRIPTION OF THE DRAWINGS

FIGS. 5a through 5d illustrate styles of off-axis illumination which can advantageously be used to pattern very fine features.

DETAILED DESCRIPTION

Typically semiconductor devices are formed in a substrate, normally the surface of a semiconductor wafer, most often monocrystalline silicon. There has been steady pressure to decrease cost of semiconductor devices by decreasing pitch of patterned features in the substrate, allowing more devices to be packed into a given substrate area. It is common to form transistors, for example CMOS transistors, in the substrate while forming multiple wiring levels above the substrate.

Device dimensions can be described by the terms pitch and critical dimension. Pitch was defined earlier as the center-to-center distance between features of an integrated circuit. This distance is apparent when features are regular or repeating; for example, when there is a plurality of parallel lines with consistent size and spacing. Pitch can be used to describe features without this regularity as well, however. When features are not regular or repeating, pitch is considered herein to be the sum of the minimum line and the minimum space, even if these features are not next to each other.

Critical dimension is the size of the smallest geometrical features (width of interconnect line, contacts, trenches, etc.) which can be formed during semiconductor device/circuit manufacturing using a given technology. Pitch and critical dimension traditionally increase at higher wiring levels for a variety of reasons.

Figure 1:
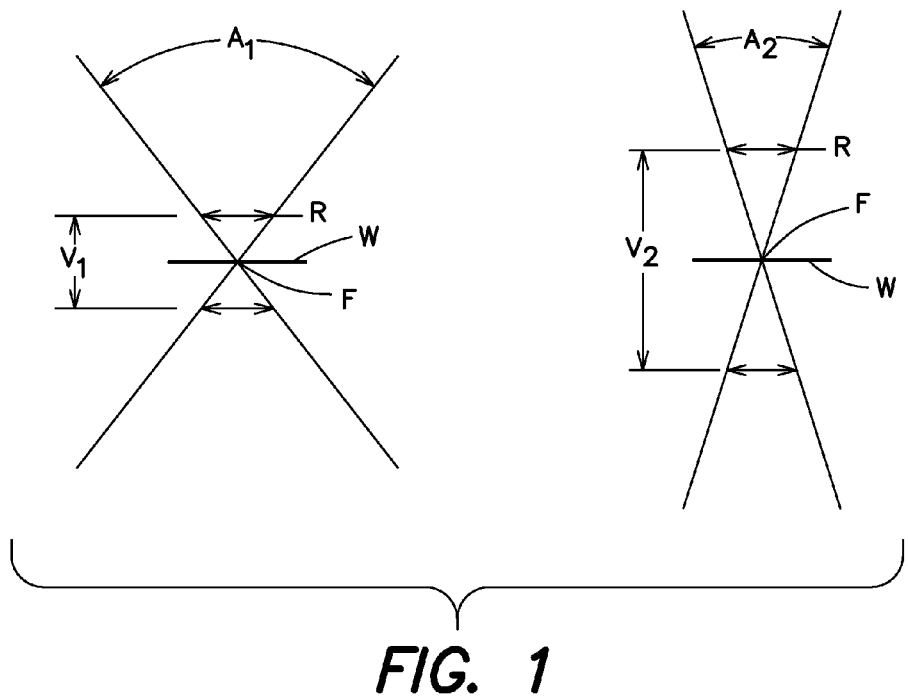
FIG. 1 is a cross-sectional view showing depth of focus with different numerical apertures.

In a photolithographic process, photoresist is deposited over a surface, and then a pattern is projected onto it using a mask. The photoresist changes in response to exposure to light such that the exposed photoresist (or the unexposed photoresist, if negative photoresist is used) is removed in a developing process. Finer features can be printed by increasing the numerical aperture of the lens used to project the features. For example, turning to FIG. 1, finer features can be printed using numerical aperture $A_1$ higher than numerical aperture $A_2$.

On a perfectly planar, perfectly oriented wafer surface W oriented perpendicular to a light source (and perpendicular to the page), features will be printed precisely at the focal point F. In practice, the surface is not perfectly planar and may be imperfectly oriented, but features can be printed with acceptable accuracy within a range of focal point F.

It will be seen that for high numerical aperture $A_1$, the range R of acceptable focus occurs over a small vertical distance $V_1$ relative to the same range R which occurs over a larger vertical distance $V_2$ for low numerical aperture $A_2$. A high numerical aperture is necessary to print small features; thus for a non-planar surface it becomes difficult to print small features while keeping them all within the acceptable depth of focus.

In addition, for wiring formed higher above the substrate, the longer lengths of interconnects cause the resistance and the capacitance to go up, causing them to become slower. To compensate, it is usual to make such interconnects wider and thicker and spaced apart in order to decrease their resistance and capacitance, thus serving to further increase pitch and topography.

Another factor that may cause across-die or across-wafer deviations from planarity is chemical-mechanical polishing (CMP), a process used to smooth and planarize a surface. Depending on the stiffness of the pad used for polishing, CMP can tend to smooth local irregularities, while at the same time introducing across-wafer non-planarity over longer distances. The wafer tends to polish faster toward its center than toward its outer edges, for example.

Monolithic three dimensional memory arrays involve extensive fabrication above a semiconductor substrate. Such memory arrays are described in Johnson et al. U.S. Pat. No. 6,034,882, "Vertically Stacked Field Programmable Nonvolatile Memory and Method of Fabrication;" Johnson, U.S. Pat. No. 6,525,953, "Vertically Stacked Field Programmable Nonvolatile Memory and Method of Fabrication;" Knall et al. U.S. Pat. No. 6,420,215, "Three Dimensional Memory Array and Method of Fabrication;" Lee et al. U.S. patent application Ser. No. 09/927,648, "Dense Arrays and Charge Storage Devices, and Methods for Making Same," filed Aug. 13, 2001; Vyvoda et al. U.S. patent application Ser. No. 10/185,507, "Electrically Isolated Pillars in Active Devices," filed Jun. 27, 2002; Herner et al. U.S. patent application Ser. No. 10/326,470, "An Improved Method for Making High Density Nonvolatile Memory," filed Dec. 19, 2003; Walker et al. U.S. patent application Ser. No. 10/335,089, "Method for Fabricating Programmable Memory Array Structures Incorporating Series-Connected Transistor Strings," filed Dec. 31, 2002; Scheuerlein et al. U.S. patent application Ser. No. 10/335,078, "Programmable Memory array Structure Incorporating Series-Connected Transistor Strings and Methods for Fabrication and Operation of Same," filed Dec. 31, 2002 (hereinafter the '078 application); and Vyvoda U.S. patent application Ser. No. 10/440,882, "Rail Schottky Device and Method of Making," filed May 19, 2003, all assigned to the assignee of the present invention and hereby incorporated by reference.

A monolithic three dimensional memory array is one in which multiple memory levels are formed above a single substrate, such as a wafer, with no intervening substrates. In contrast, stacked memories have been constructed by forming memory levels on separate substrates and adhering the memory levels atop each other, as in Leedy U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

Typically, in monolithic three dimensional memory arrays, a plurality of substantially coplanar memory cells is formed at substantially the same height above a substrate. The cells may be formed, for example, at the intersections of rails 10, as in FIG. 10a, or in pillars 20 interposed between rail intersections, as in FIG. 10b. A plurality of substantially coplanar cells formed at substantially the same height above a substrate will be referred to as a memory level. A memory level is considered to include the rails 10 above and below the memory cell at which they intersect. In some monolithic three dimensional memory arrays, levels immediately adjacent may share rails 10, such that the upper rail 10 of one memory level is the lower rail of the one above.

In an advantageous arrangement employed in the monolithic three dimensional memory arrays referred to above, CMOS support circuitry, for example driver circuitry, is formed in the substrate, while a plurality of memory levels are formed over the substrate. In some embodiments, other levels may exist, such as wiring or other support circuitry, which may be between the substrate device level and the overlying memory levels, or elsewhere.

For monolithic three dimensional memory arrays, the pitch requirements for the CMOS device level in the substrate and the memory levels above it are largely independent. Moving value functionality above the substrate allows the CMOS device level to be formed at lower density, with a larger pitch than the levels above it, reversing the usual trend. It can thus be formed using less expensive lithography tools. Use of high-cost lithography can be limited to memory levels where density is crucial, thus lowering the overall cost of the die.

The discussion and examples here will refer to memory levels formed over CMOS device drivers. But clearly in any situation in which value functionality moves into levels formed above a substrate, the same scheme could be used to advantage.

A device level is a plurality of devices formed at substantially the same height in or above a substrate. The device level may comprise the substrate or may be substantially parallel to the substrate and be formed entirely above it. "Substrate" is used herein to refer to a portion of the monocrystalline semiconductor surface, normally a silicon wafer. Traditionally other layers are deposited or grown on this semiconductor surface; these layers are considered to be above the substrate.

A device level in which any portion of the constituent devices is formed by part of the substrate wafer or located in or below the substrate surface is referred to herein as a substrate device level. Vertical interconnects and contacts with the purpose of making electrical contact to a device are not considered to be part of the device.

Figure 2:
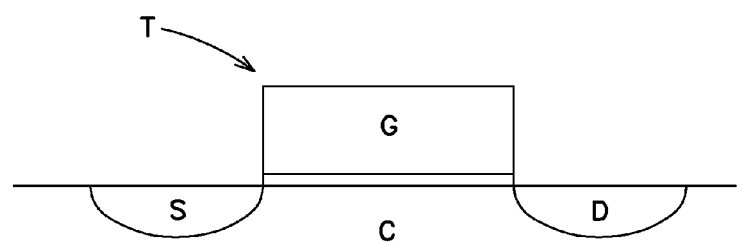
FIG. 2 is a cross-sectional view of a CMOS transistor formed in a substrate.

An example of a substrate device level is CMOS transistors formed in the substrate. Such a CMOS transistor is shown in FIG. 2. The source S, channel region C, and drain D of the transistor are made up of the substrate itself, for example, a monocrystalline silicon wafer. The gate electrode G is formed above the substrate, perhaps of polycrystalline silicon, also called polysilicon. Note that the entire transistor T is considered to be part of a substrate device level, even though part of it, gate electrode G, is formed above the substrate. A substrate device level is a level which has any portion formed in the substrate.

The present invention thus provides for a semiconductor die comprising a substrate device level and above-substrate device levels formed above it. In aspects of the present invention, the substrate device level has a substrate critical dimension, while a device level formed above it, for example a memory level, has a smaller critical dimension. In one embodiment, the substrate critical dimension is about 0.33 micron, while the above-substrate device level is about 0.25 micron. In another embodiment, the substrate critical dimension is about 0.25 micron and the above-substrate critical dimension is about 0.15 micron.

Figure 11:
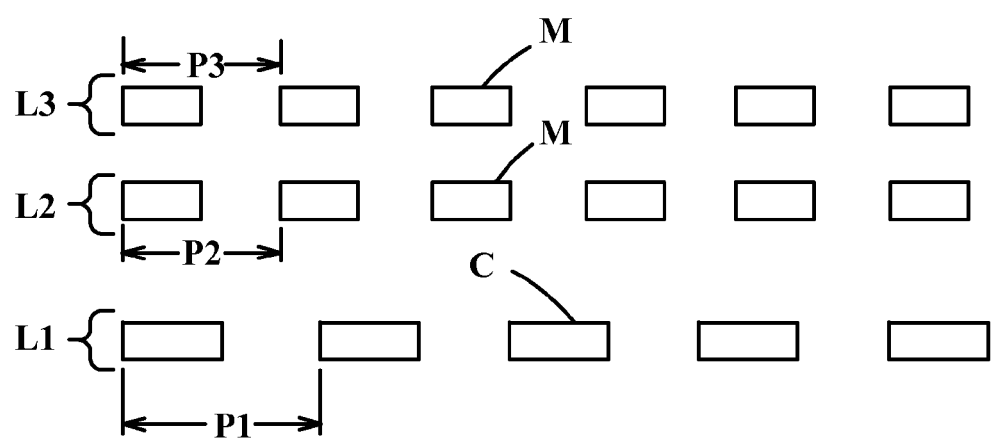
FIG. 11 is an elevation view of a semiconductor die including a first device level having a first pitch, a second device level having a second pitch, and a third device level having a third pitch.

FIG. 11 illustrates a semiconductor die comprising: a substrate device level L1 having a substrate pitch P1; and a first above-substrate device level L2 formed above the substrate device level L1, the first above-substrate device level having a first above-substrate pitch P2, wherein the first above-substrate pitch P2 is smaller than the substrate pitch P1. A second above-substrate device level L3 is formed over the first above-substrate device level L2, the second above-substrate device level L3 having a second above-substrate pitch P3, wherein the second above-substrate pitch P3 is smaller than the substrate pitch P1.

It may also prove advantageous for intervening layers, for example one or more layers providing electrical interconnection having an intermediate critical dimension or pitch to be formed between the substrate having the substrate critical dimension or pitch and the memory level having the smaller critical dimension or pitch.

If the critical dimension of the substrate device level is larger than the critical dimension in the above-substrate device level, then clearly the pitch may also be larger in the substrate device level than in the above-substrate device level.

In one example, the substrate device level pitch is about 0.65 micron, while the above-substrate device level pitch is about 0.5 micron.

It is also possible for critical dimensions in the substrate device level and in an above-substrate device level to be the same, while pitch is different. This might be the case if, for example, both have features that are 0.15 micron wide, but the intervening space in the substrate device level is larger than the intervening space in the above-substrate device level.

Figure 3:
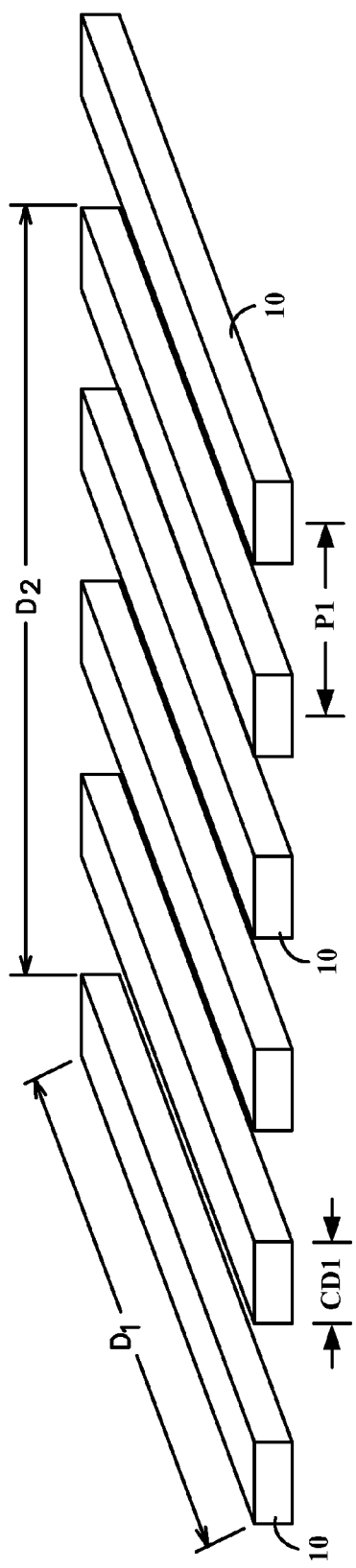
FIG. 3 is a perspective view of substantially parallel, substantially coplanar rails.

For a repetitive pattern, such as the plurality of substantially parallel, substantially coplanar rails 10 shown in FIG. 3, pitch (e.g., P1) is the distance from the center of one rail 10 to the center of the rail next to it. Critical dimension (e.g., CD1) is the width of a rail 10 (or of the gap between rails). If the rails 10 and the gaps between them are the same width, then critical dimension is half of pitch. Critical dimension is always less than pitch, though it may be more than half, less than half, or exactly half of pitch. The monolithic three dimensional memory arrays referred to earlier comprise rails such as rails 10 shown in FIG. 3.

Many techniques can be employed to decrease pitch and increase density in memory levels formed above a substrate. One such technique is the use of dummy features to improve the planarity of a surface after CMP, as described in Cleeves et al. U.S. Pat. No. 6,486,066, "Method of Generating Integrated Circuit Feature Layout for Improved Chemical Mechanical Polishing," hereby incorporated by reference.

The aim of increasing density of valuable device area while minimizing overall photolithography cost can also be achieved by optimizing lithographic techniques to minimize pitch in the high-value features of a device plane while sacrificing pitch in the lower-value features of the same device plane.

Figure 4:
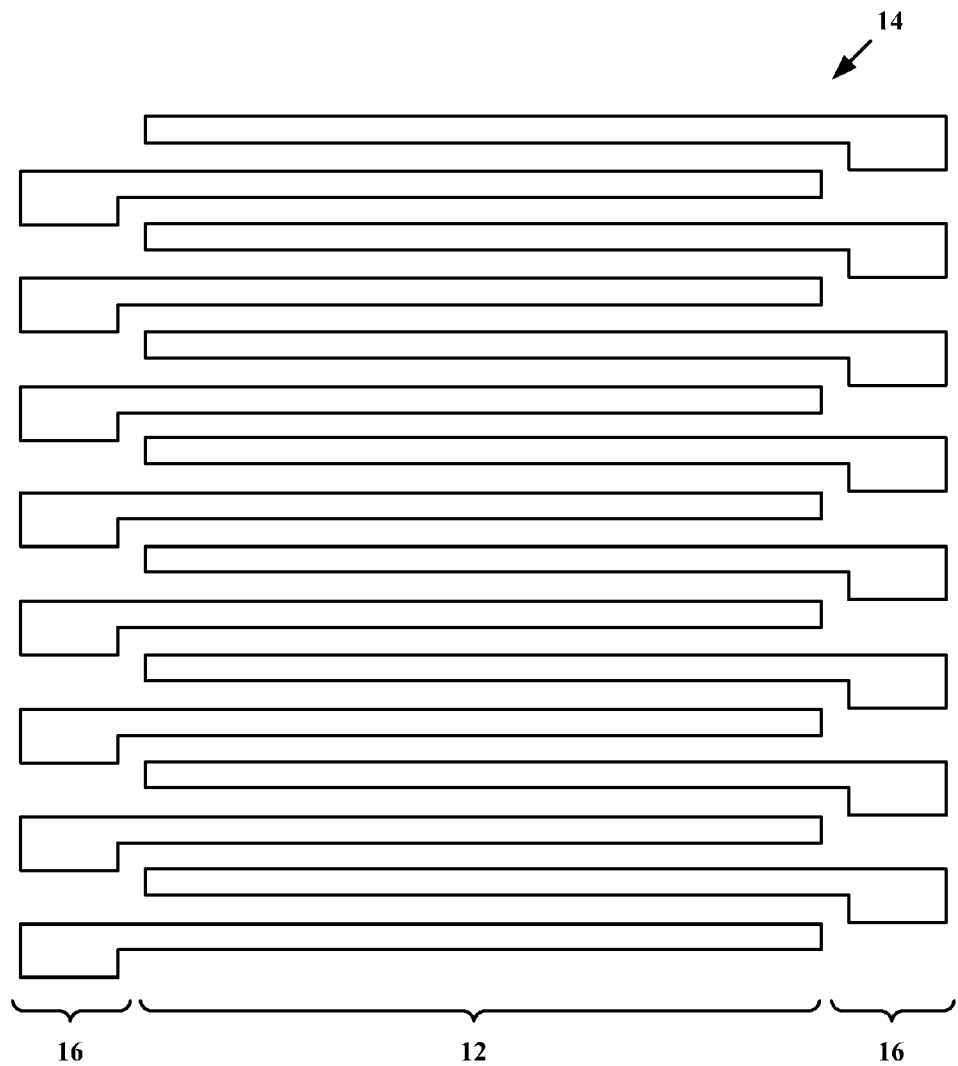
FIG. 4 is a plan view of a portion of a device level having an array area with a first pitch and a second area with a second, larger pitch.

As illustrated in FIG. 4, it is usual for the uniform, repetitive array area 12 of a memory level 14 in a monolithic three dimensional memory array to be surrounded by or adjacent to an area 16 providing electrical connections to other memory levels or the substrate; this surrounding or adjacent area 16 will be referred to as the fan-out region. The fan-out region 16 typically will not have the same repetitive pattern as the features within the array area. It may be advantageous to optimize photolithographic techniques to form the dense array area 12 at the expense of the density of the fan-out region 16.

Some memory cells in monolithic three dimensional memory arrays can take the form of diode-antifuse pairs between conductors. When the antifuse is intact, no current flows between the conductors; when the antifuse is ruptured, current is able to flow. The state of the antifuse, intact or ruptured, determines the state of the memory cell, programmed or unprogrammed (or vice versa.) The diode-antifuse pairs may reside in pillars between conductors (as in Johnson or Johnson et al., Herner et al., and Vyvoda et al.), or at the junctions of rails or rail-stacks in a cross-point array (as in Knall et al. and Vyvoda.)

In other monolithic three dimensional memory arrays, a memory cell is a field effect transistor with a charge storage region, for example a floating gate or SONGS cell, as in Lee et al., Walker et al., and the '078 application. In such transistors the presence or absence (or amount) of stored charge determines the programmed or unprogrammed state of the memory cell.

Figure 10A:
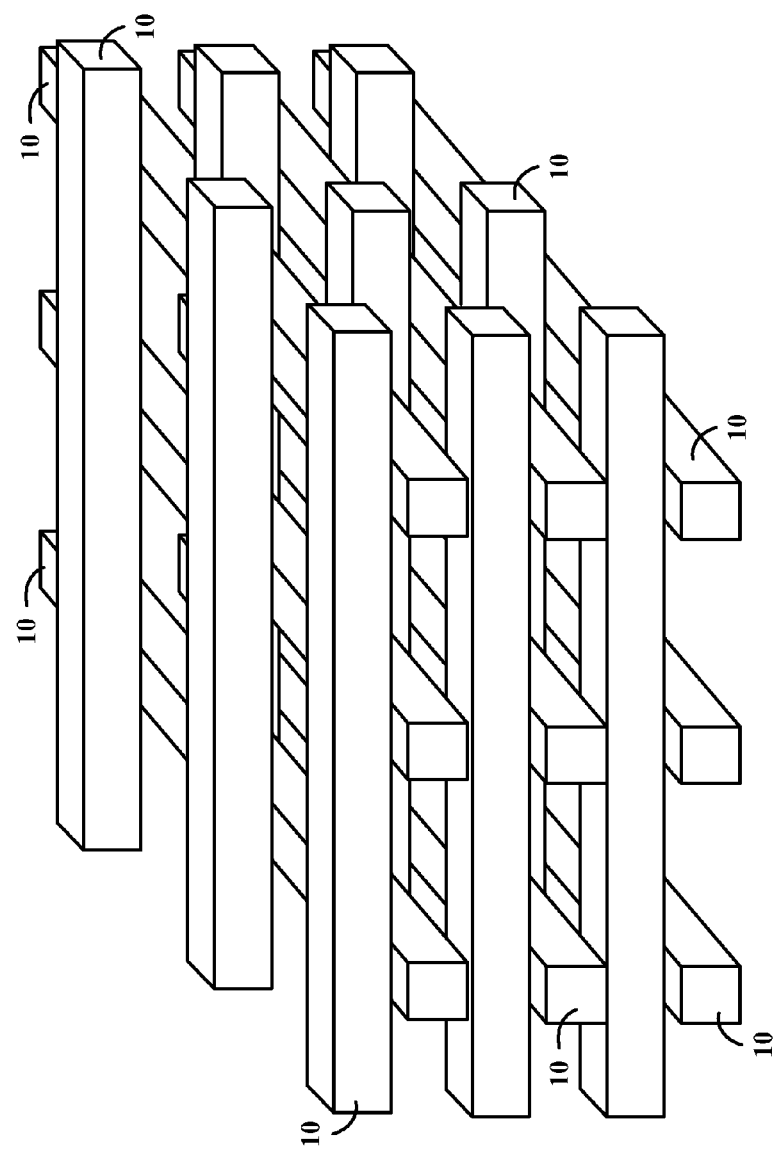
FIGS. 10a and 10b are perspective views of rail and pillar configurations, respectively, of exemplary monolithic three dimensional memories.
Figure 10B:
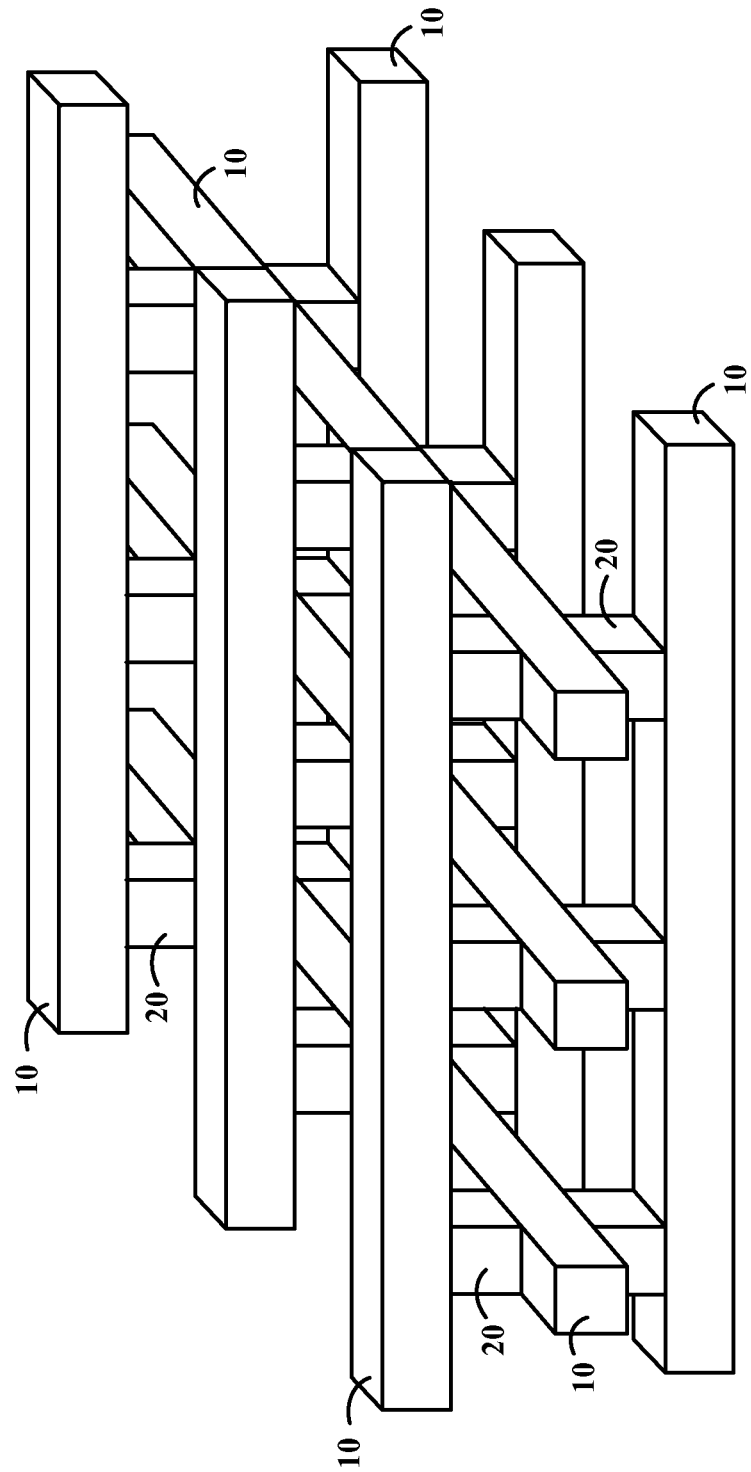

Memory levels of the monolithic three dimensional memory arrays described in the incorporated patents and applications, including either of these types of cells (antifuse-diode cells or charge-storage cells), are generally laid out in a cross-point array, like those shown in FIG. 10a or 10b. In some of these memory arrays, memory cells reside at the intersections of rails 10, as in FIG. 10a. In others, memory cells reside in pillars 20 disposed between intersecting rails 10, as in FIG. 10b. Photolithographic techniques can advantageously be optimized to minimize pitch within the cross-point array.

To form substantially parallel linear features, such as the conductors 10 in a cross-point array shown in FIG. 3, it may be useful to print such features using a lens that is astigmatic such that edges in one direction (in this case, $D_1$, the direction in which the conductors 10 run) are in sharp focus, while those perpendicular to $D_1$, extending in direction $D_2$, are out of focus. Focus is thus improved for edges extending in direction $D_1$ at the expense of the focus of edges extending in direction $D_2$. When linear shapes are being formed, this trade-off is advantageous.

Another optimization technique is mask bias. If, for example, it is found that in the regular, uniform part of the array, a critical dimension in the photomask of 0.25 micron will produce an etched feature with a critical dimension of 0.2 micron, and a critical dimension of 0.25 is desired, it may be advantageous to bias the mask; in this case, for example, it may be found that a mask dimension of 0.3 micron will produce an etched dimension of 0.25 micron.

In the example of a cross-point array given here, the regular, repetitive features described are linear, parallel features. It will be understood by those skilled in the art, however, that other shapes could be repeated in a regular fashion. For example, in Herner et al., a plurality of pillars that are advantageously arranged uniformly is patterned and etched. Any repeated pattern, for which photolithographic conditions across a die or across a wafer will be uniform, is highly susceptible to optimization.

When patterning using a photomask, light is projected through an illumination aperture. Off-axis illumination, in which the illumination aperture is manipulated, can be used to optimize photolithography for patterning regular features. The conventional illumination aperture is shown in FIG. 5a. (These drawings are not to scale.) Conventionally, measuring from the center of the lens, the center portion of the lens, with a radius 0.7 of the entire lens, transmits light. The remaining 0.3 of the radius to the outer edge of the lens is obscured.

Figure 5B:
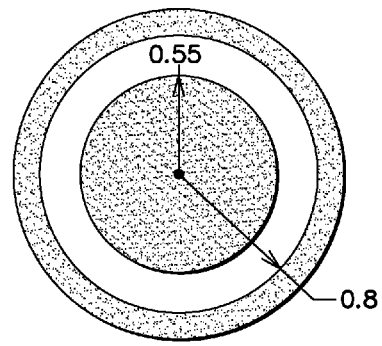

An annular aperture can be used instead, shown in FIG. 5b. The center of the lens is obscured, an annulus around the center admits light, and the outer edge of the lens is obscured. In a preferred embodiment, measuring from the center, the center obscured section reaches to between about 0.35 and about 0.6 of the radius. It is preferred for the center obscured section to reach to between about 0.55 and 0.6 of the radius. FIG. 5b shows this section reaching to about 0.55 of the radius. The annulus that transmits light extends from the outer edge of the obscured section, from about 0.35 to about 0.6 of the radius, to a distance from about 0.7 to about 0.875 of the radius; between about 0.8 and about 0.875 of the radius is preferred. FIG. 5b shows the annulus reaching to about 0.8 of the radius. From the transmitting annulus to the outer rim is obscured.

Figure 5C:
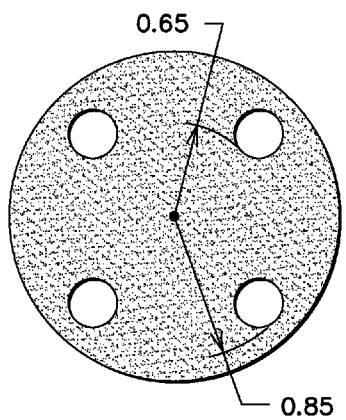

A quadrupole aperture admits light through four holes, as shown in FIG. 5c. The outer edge of each hole is between about 0.8 and 0.9 of the radius, preferably at about 0.85 of the radius, while the inner edge of each hole is at about 0.6 to about 0.7 of the radius, preferably at about 0.65 of the radius. FIG. 5c shows the inner edge of each hole at about 0.65 of the radius and the outer edge at about 0.85 of the radius. Each hole is circular, and the holes are located with centers rotated 45 degrees from vertical and horizontal, as shown.

Figure 5D:
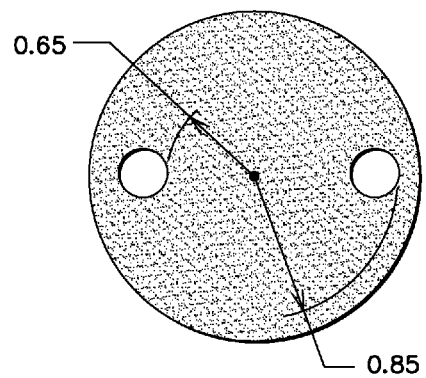

A dipole aperture admits light through two holes, as shown in FIG. 5d. The outer edge of each hole is between about 0.8 and 0.9 of the radius, preferably at about 0.85 of the radius, while the inner edge of each hole is at about 0.6 to about 0.7 of the radius, preferably at about 0.65 of the radius. FIG. 5d shows the inner edge of each hole at about 0.65 of the radius and the outer edge at about 0.85 of the radius. The holes are oriented horizontally and are symmetric about the center point of the lens.

These various illumination apertures can advantageously be combined with phase shift masks.

Figure 6A:
FIGS. 6a, 6b, and 6c illustrate a binary mask, an attenuated phase shift mask, and an alternating phase shift mask.
Figure 6B:
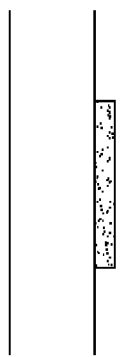
Figure 6C:
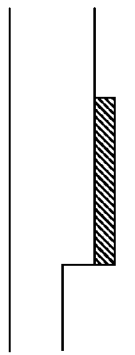
Figure 7A:
FIGS. 7a, 7b, and 7c illustrate the electrical field in the mask plane for a binary mask, an attenuated phase shift mask, and an alternating phase shift mask.
Figure 7B:
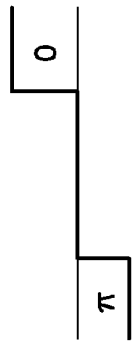
Figure 7C:
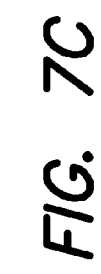

A conventional binary mask, an attenuating phase shift mask, and an alternating phase shift mask are shown in FIGS. 6a, 6b, and 6c, respectively. The mask projects a shape onto photoresist, which is exposed and developed, leaving behind patterned portions of the photoresist which will serve to protect the underlying material from etchants, as is well known in the art. The binary mask simply blocks light in some spots and admits it in others. The attenuating phase shift mask and the alternating phase shift mask, however, invert the phase of light as it passes through the mask, causing it to be 180 degrees where the phase is shifted; the electrical field in the mask plane is shown in FIGS. 7a, 7b, and 7c, respectively, for the binary mask, the attenuating phase shift mask, and the alternating phase shift mask.

Figure 8A:
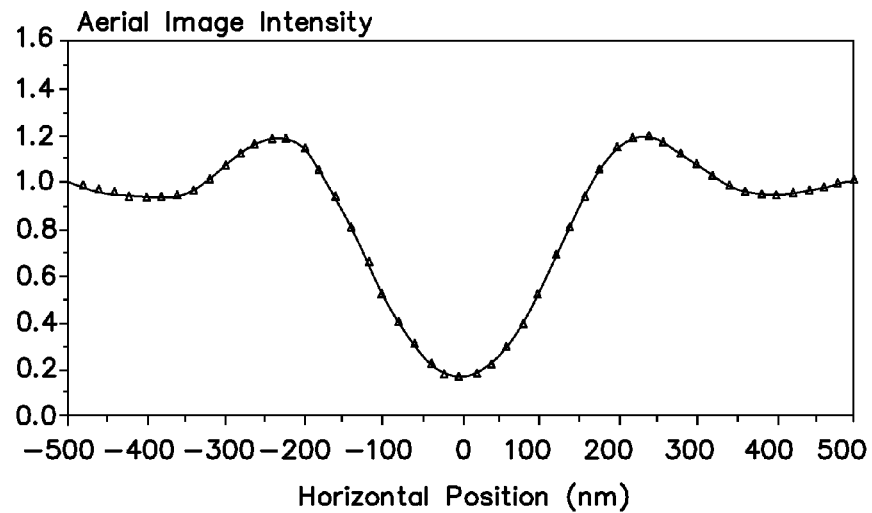
FIGS. 8a, 8b, and 8c illustrate intensity of light in the wafer plane for a binary mask, an attenuated phase shift mask, and an alternating phase shift mask.
Figure 8B:
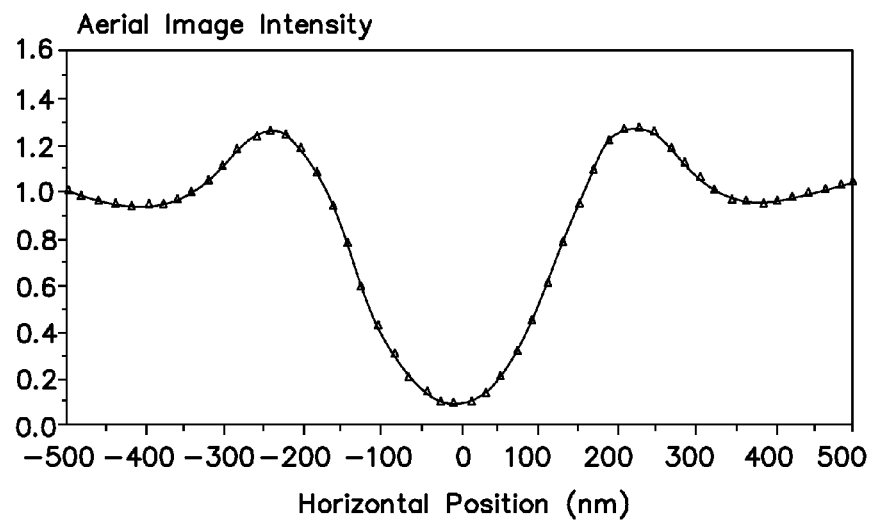
Figure 8C:
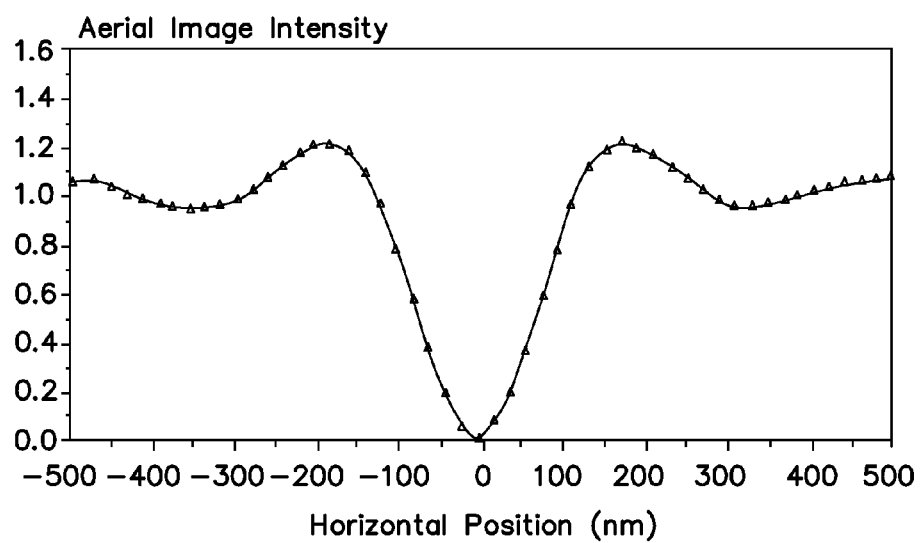

The intensity at the surface being patterned is shown in FIGS. 8a, 8b, and 8c, respectively, for the binary mask, the attenuating phase shift mask, and the alternating phase shift mask. It will be seen that the attenuating phase shift mask increases contrast over the binary mask, and the alternating phase shift mask increases it further still.

An attenuated phase shift mask will be effective with an annular aperture, better with a quadrupole aperture, and better still with a dipole aperture. The dipole aperture is effective for patterning a regular line-space pattern, when the lines being patterned are oriented perpendicular to a line passing between the holes and the center of the lens.

An alternating phase shift mask paired with a quadrupole aperture is highly effective for patterning regularly spaced pillars. A novel alternating phase shift mask useful for patterning regularly spaced pillars is disclosed in Chen U.S. patent application Ser. No. 10/728,436, filed on Dec. 5, 2003 and hereby incorporated by reference.

Specific examples of photolithographic techniques have been described. As those skilled in the art will appreciate, however, this description is merely exemplary, and is not intended to be limiting. Any other techniques, methods, and technologies could be used to create the same structures while still falling within the scope of the invention.

Photolithographic techniques optimized to form the uniform array area, such as those described above, likely will prove not to be ideal for patterning and etching the less-uniform fan-out region. To avoid photolithographic and etching flaws in the fan-out region, it has been found to be advantageous to relax the pitch requirements in the fan-out region so that the fan-out region has a larger pitch, and larger critical dimensions, than the array area. The optimizations described here, and others, allow tighter pitch to be achieved in the uniform array area than would normally be achievable given a certain lithography tool.

In some embodiments of the present invention, then, a device level may comprise two areas. The first area comprises a plurality of substantially parallel, substantially coplanar rails with a first pitch and a first critical dimension. The second area comprises a fan-out region with a second pitch and a second critical dimension. The second critical dimension will be larger than the first critical dimension.

For example, if the first critical dimension is 0.15 micron, the second critical dimension may be 0.3 micron. Both array areas are formed in the same patterning steps. Photolithographic techniques optimized for forming rails are used to pattern the semiconductor device level. These techniques likely are not optimal for formation of the fan-out region, but the larger pitch of the fan-out region gives it higher tolerance for error.

Other factors must be considered as well. While shrinking the pitch of the memory array is advantageous for the reasons described, at some point a practical limit is reached: No matter how dense the memory array becomes, it must be connected to peripheral support circuitry, such as drivers, decoders, etc., formed in the substrate.

As the memory array gets smaller, these connections, which must connect in the fan-out region, become more difficult to make. Generally a connection must be made at the end of each conductor, but the vertical connections and the substrate circuitry, since they don't benefit from the patterning advantages described earlier herein, cannot normally be made at the same pitch as the memory.

Figure 9:
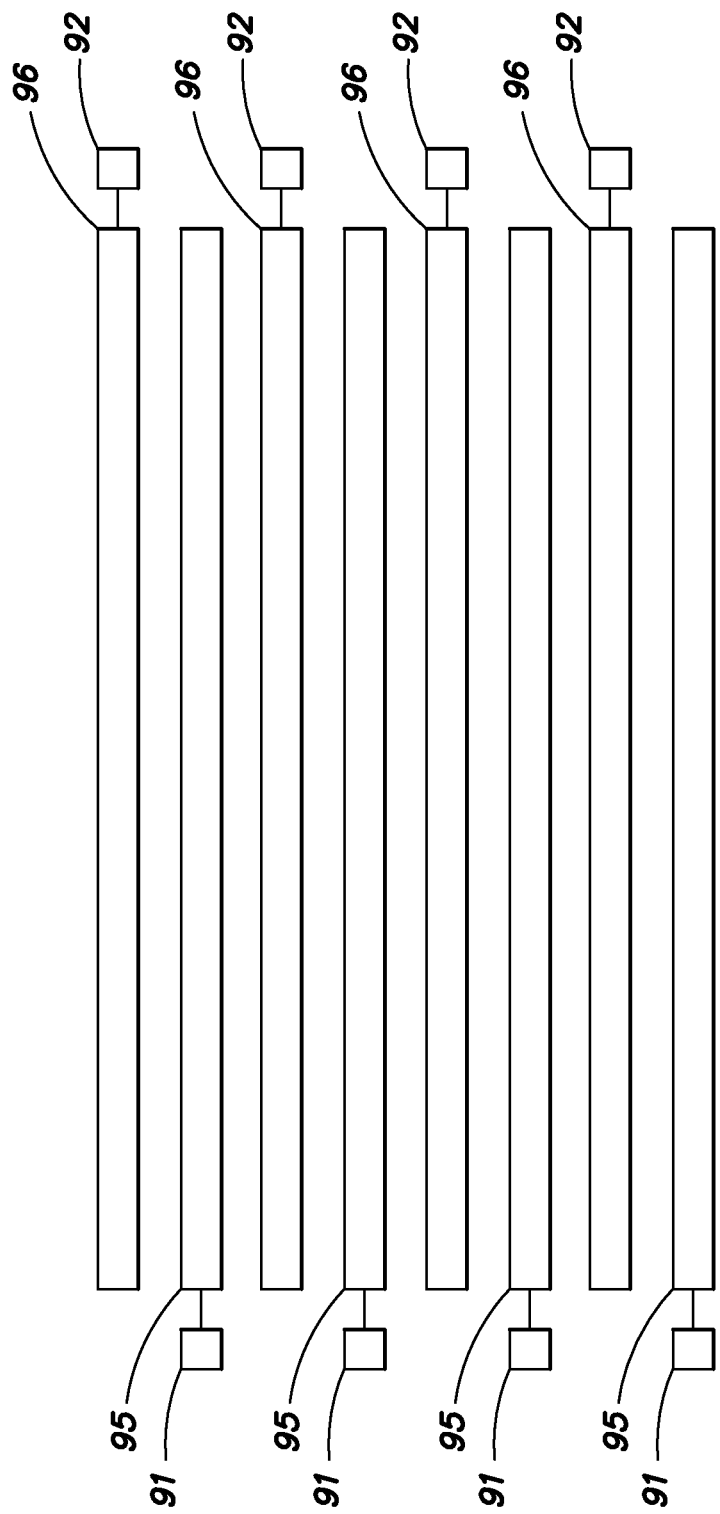
FIG. 9 is a plan view of a wiring arrangement to make electrical connection to a tight memory array.

Various approaches have been used to compensate for the difficulty of making connections on pitch. In Scheuerlein et al. U.S. patent application Ser. No. 10/306,887, "Multi-Headed Decoder Structure Utilizing Memory Array Line Driver With Dual Purpose Driver Device," filed Nov. 27, 2002 (hereinafter the '887 application) and hereby incorporated by reference, for example, it is described that connections are interleaved; that is the electrical connection at the end of one conductor will be made, for example, at the left side of the array, while the connection to the end of the adjacent conductor will be at the right side of the array, as shown in FIG. 9. In this way, for a single memory level, the pitch of the connections can be twice the pitch of the memory. The disadvantage of this scheme is that it requires substrate area on both sides of the array, increasing the substrate area used.

The challenge is compounded as memory levels are stacked atop each other. If, for example, a memory level is formed over a substrate, and three more memory levels are formed over the first memory level, connections must be made to those four levels of conductors, one atop the other, at the end of the array. The '887 application describes a scheme that places the four connections side-by-side at the end of the conductor. This approach successfully places the contacts within pitch, but also increases substrate area used.

In some monolithic three dimensional memory array embodiments, there is in fact unused substrate area available under the memory array. But this area cannot be used for connection to support circuitry. If support circuitry were formed under the array, vertical connections, or vias, would have to extend vertically through the dense array in order to connect to them. But conductors within the memory are formed packed as densely as possible. Vias cannot be placed between conductors without shorting memory lines.

The vias, then, must be outside of the array area, and so the actual connection to the substrate must also be outside of the array area, increasing substrate area used. As noted earlier, optimization of photolithography allows structures to be patterned more tightly within uniform areas, such as the memory array, than in nonuniform areas, such as the underlying CMOS formed in the substrate, using the same photolithography tools.

To form substrate CMOS at the same pitch as the memory array would require using higher cost photolithography tools. This is very expensive, especially since typically more masks are required to pattern the substrate than to pattern the memory array. The alternative, relaxing pitch in the substrate using the connection schemes described, requires more substrate area than is desirable.

Advantageous layout and via arrangements can be employed, however, which significantly reduce the substrate area required for support circuitry.

In general these space-saving via arrangements involve arranging cells in NAND strings, sharing a vertical connection between segmented bit lines to global bit lines, and sharing a vertical connection between segmented word lines all driven by a segmented word line driver.

The '078 application teaches a monolithic three dimensional memory array of thin film transistors having a charge-storage dielectric arranged in series-connected NAND strings. Each NAND string includes two block select devices for respectively coupling one end of the NAND string to a global bit line and the other end to a shared bias line. Pairs of NAND strings within a block share the same global bit line. NAND strings on more than one layer may be connected to global bit lines on a single layer. A preferred embodiment is shown in FIG. 3 of the '078 application.

Figure 12:
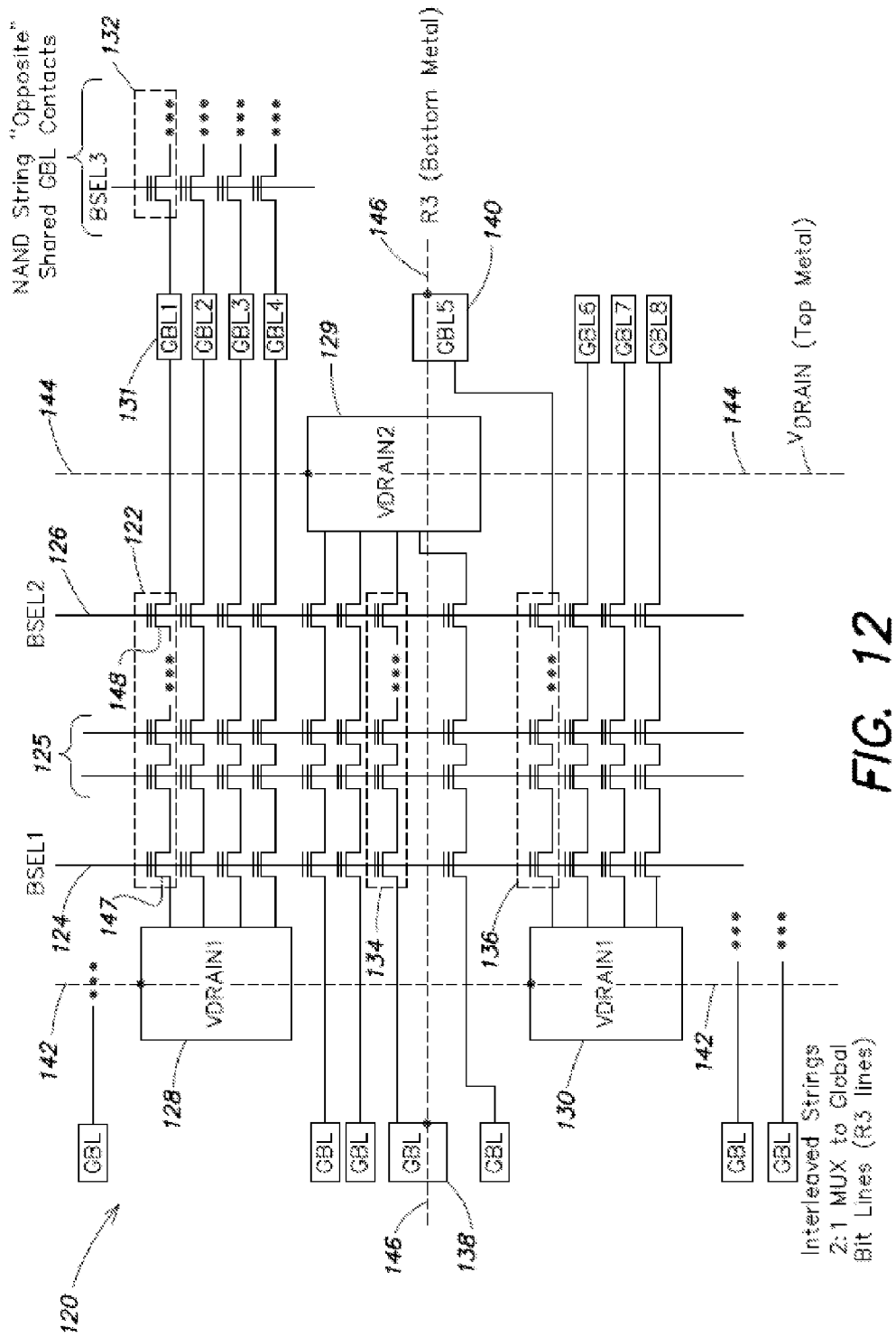
FIG. 12 is an electrical schematic of a portion of an exemplary memory array.

Referring now to FIG. 12, an electrical schematic is shown of a portion of an exemplary memory array. The portion shown may represent a two-dimensional array having only one plane of memory cells, or may represent one level of three-dimensional memory array having more than one level (i.e., more than one plane) of memory cells.

A plurality of series-connected NAND transistor strings is shown, one of which is labeled 122. Each string includes a plurality of SONGS transistors connected in series, each gated by a respective one of a plurality of word lines 125.

The NAND string 122 also includes a block select device 148 for coupling one end of the NAND string to a global bit line contact 131 in accordance with a block select signal BSEL2 conveyed on node 126, and further includes a second block select device 147 for coupling the other end of the NAND string to a shared bias node 128 in accordance with a block select signal BSEL1 conveyed on node 124. The global bit line contact 131 is shared with another NAND string 132 which is disposed on the other side of (i.e., opposite) the global bit line contact 131 and is independently selectable by another block select signal BSEL3.

As is depicted in the figure, a group of four laterally adjacent NAND strings share a common bias node 128, which may be termed VDRAIN1, disposed at the left end of the NAND strings, but are individually coupled to a respective one of four global bit line contacts disposed at the right end of the NAND string. The next group of four laterally adjacent NAND strings is reversed, and the NAND strings in the group are individually coupled to a respective one of four global bit line contacts disposed at the left end of the NAND strings. This next group of NAND strings shares a common bias node 129, which may be termed VDRAIN2, disposed at the right end of the NAND strings.

As may be appreciated, the block select signal BSEL1 couples the left end of half of the NAND strings to an associated global bit line, while the same signal couples the right end of the other half of the NAND strings to the shared bias node VDRAIN1. Similarly, block select signal BSEL2 couples the right end of half of the NAND strings to an associated global bit line, while the same signal couples the right end of the other half of the NAND strings to the shared bias node VDRAIN2.

This structure interleaves the NAND strings by coupling two different NAND strings to the same global bit line. For example, the left end of NAND string 134 is coupled by BSEL1 to a global bit line contact 138, while the right end of NAND string 136 is coupled by BSEL2 to a global bit line contact 140. These two global bit line contacts 138 and 140 are preferably connected to the same global bit line, which may be routed horizontally on a wire 146 conveyed on a different wiring level. Such global bit lines may be conveyed a wiring level below the array, or alternatively above the array, or alternatively on a wiring level within the array (e.g., in a three-dimensional array having more than one level).

The NAND string 134 and 136 may be referred to as "adjacent" NAND strings, as sharing the same global bit line and sharing the same word lines (i.e., within the same block of the array), even though there is another NAND string disposed between them. It is still possible to select only one of these two NAND strings for reading and writing because the shared bias nodes VDRAIN1 and VDRAIN2 are distinct and may be driven to different conditions, as is described in regards to the next several figures.

Each of these two shared bias nodes VDRAIN1 and VDRAIN2 is shared by NAND strings in two adjacent blocks, and thus are preferably conveyed in vertical wires 142 and 144, respectively, which are preferably conveyed on a wiring level "above" the memory array (i.e., further from the semiconductor substrate). Consequently, the two shared bias nodes VDRAIN1 and VDRAIN2, the block select signals BSEL1 and BSEL2, and the various word lines 125, which all traverse across the memory array in the same direction, may be more conveniently decoded and driven to appropriate levels.

As described above, the memory cells in the NAND strings (i.e., those gated by one of the word lines) are preferably SONGS structures. As used herein, the term SONGS is meant to refer to the general class of transistor devices having a charge storage dielectric layer between the gate and the underlying channel, and is not used in a restrictive sense to merely imply a literal silicon-oxide-nitride-oxide-silicon layer stack. For example, other kinds of dielectric layers may be employed, such as oxynitrides, as is described in greater detail herein below.

A basic NAND string is a very efficient structure, capable of achieving a $4F^2$ layout for the incremental transistor memory cell. However, providing the necessary switch devices with appropriate control signals at the ends of the NAND strings, and the overhead of connecting such NAND strings to global bit lines and to bias or ground nodes, frequently degrades the resultant total efficiency. In contrast, the structure depicted in FIG. 12 achieves very dense layout because of the interleaving of two NAND strings, both coupled to the same global bit line, thus relaxing the pitch requirements for the global bit lines by a factor of two.

The structure depicted in FIG. 12 also achieves very dense layout because only one control signal is utilized at each end of the NAND strings. This allows the two block select lines BSEL1 and BSEL2 to route in continuous polysilicon stripes across the plurality of channel stripes, just like the word lines, without any provision being otherwise required for contacting a block select signal line to some but not all of the block select transistors formed in the channel stripes.

Another factor contributing to the efficiency of this array structure is the ability of the block select devices to be fabricated identically to the memory cell devices. In other words, the block select devices may be SONGS devices just like the memory cell devices. In 3D array embodiments having more than one memory level formed above a semiconductor substrate, each memory level consequently includes only one type of device, further simplifying the fabrication of each level. The block select devices may be sized identically to the memory cell devices, but preferably may have a longer channel length (i.e., wider polysilicon stripe for the block select signals) to increase the breakdown voltage of the block select devices.

Other space-saving techniques are also taught in this application that offer further advantage: A single vertical connection is shared between bit line segments from each of two adjacent blocks, for example. Interleaving, mentioned earlier, is also taught.

As shown in FIG. 9 of the instant application, in this technique the substantially parallel, coplanar rails comprise at least two pluralities of memory lines. A first plurality 95 of memory lines is electrically connected to a first plurality 91 of vertical interconnects at a first end and a second plurality 96 of memory lines is electrically connected to a second plurality 92 of vertical interconnects at a second end opposite the first end, and the first and second pluralities of memory lines interleaved. Any other relevant techniques from the '078 application may be used as well.

Use of a shared vertical connection to a global bit line is described in Scheuerlein et al. U.S. patent application Ser. No. 10/403,752, "Three-Dimensional Memory Device Incorporating Segmented Bit Line Memory Array," filed Mar. 31, 2003, hereinafter the '752 application, and hereby incorporated by reference. This application teaches a monolithic three dimensional memory array including multiple layers of segmented bit lines (i.e., sense lines) with segment switch devices within the memory array that connect the segments to global bit lines. The segment switch devices reside on one or more layers of the integrated circuit, preferably residing on each bit line layer. The global bit lines reside preferably on one layer below the memory array, but may reside on more than one layer. The bit line segments preferably share vertical connections to an associated global bit line. A preferred embodiment is shown in FIG. 2 of the '752 application.

Figure 13:
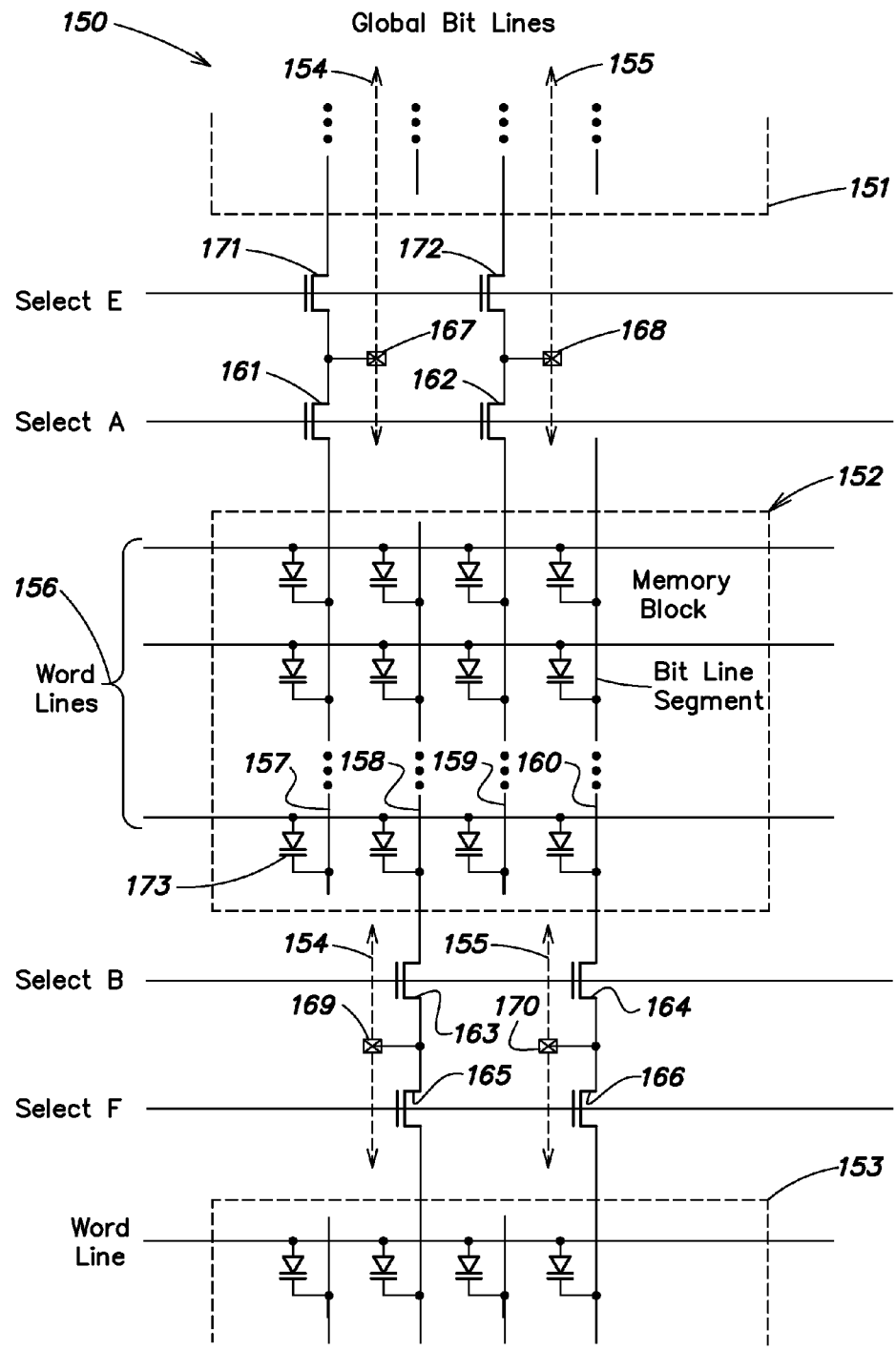
FIG. 13 depicts a schematic diagram representing a memory plane within an exemplary three-dimensional passive element memory array.

Referring now to FIG. 13, a schematic diagram is depicted which represents a memory plane within an exemplary three-dimensional passive element memory array. One such memory plane 150 is shown, although preferably other memory planes are similarly arranged, as described in greater detail herein below. The memory plane 150 includes a plurality of blocks, such as blocks 151, 152, and 153. Each block includes a plurality of word lines, such as word lines 156 associated with block 152. Each block also includes a plurality of bit line segments, such as bit line segments 157, 158, 159, and 160 associated with block 152. As indicated, a memory cell (e.g., memory cell 173) is formed between each word line and each bit line segment within a block.

Each bit line segment may be coupled to an associated global bit line by a segment switch device which is controlled by a block select signal. For example, bit line segment 157 is coupled by a segment switch device 161 to global bit line 154, which preferably resides on a different layer of the memory array. The connection path to the global bit line is formed by way of a vertical connection 167, which is shared by other memory planes, to provide a path for a bit line segment from any of at least two memory planes to be coupled to the global bit line.

The bit line segments of memory plane 150 are arranged in a 2:1 interleaved configuration, which allows the required pitch of the global bit lines to be twice that of the bit line segments. In this particular interleave arrangement half of the bit line segments within a block exit to the top of the block and are coupled under control of a SELECT-A control signal to the respective global bit lines, while the other half of the bit line segments exit to the bottom of the block and are coupled under control of a SELECT-B control signal to the same respective global bit lines.

In particular, bit line segment 158 is coupled by segment switch device 163 to a shared vertical connection 169 to global bit line 154, bit line segment 159 is coupled by segment switch device 162 to a shared vertical connection 168 to global bit line 155, and bit line segment 160 is coupled by segment switch device 164 to a shared vertical connection 170 to global bit line 155.

In this exemplary configuration each of the shared vertical connections (which are shared vertically with other memory planes) is also shared by a bit line segment in an adjacent memory block within the same memory plane. For example, a bit line segment in block 151 (unlabeled) is coupled by segment switch device 171 (under control of a block select signal SELECT-E) to the same shared vertical connection 167, and consequently to global bit line 154.

In other words, a bit line segment from each of two adjacent blocks shares a vertical connection to an associated global bit line, to achieve a global bit line pitch that is twice the pitch of the bit line segments. In particular another bit line segment in block 151 (unlabeled) is coupled by segment switch device 172 (controlled by SELECT-E) to the shared vertical connection 168, and consequently to global bit line 155.

As described below, other interleave arrangements are also contemplated. Likewise bit line segments from memory block 153 are respectively coupled by segment switch devices 165, 166 to shared vertical connections 169, 170 and consequently to global bit lines 154, 155.

In this embodiment each global bit line is operably coupled to a respective bit line segment in a selected block of a selected memory plane by driving one of the two block select control signals associated with the selected block to an active state, while leaving the other block select control signal of the selected block, and all other blocks (both on the same memory plane and on other memory planes sharing the same global bit lines), at an inactive level.

In a read operation, the signal from a memory cell is coupled from the bit line segment to a global bit line, and subsequently to sensing circuitry. In a write operation, the programming voltages and currents are conveyed from write driver circuitry, through the global bit line, through the segment switch device to the bit line segment, and coupled thereby to the selected memory cell.

Similarly, use of a vertical connection shared between word line segments on multiple layers connecting passive element memory cells to a segmented word line driver is described in Scheuerlein et al. U.S. patent application Ser. No. 10/403,844, "Word Line Arrangement Having Multi-layer Word Line Segments for Three-Dimensional Memory Array," filed Mar. 31, 2003, hereinafter the '844 application, hereby incorporated by reference. Short, low resistance word line segments on two or more word line layers are connected together in parallel to form a given word line without use of segment switch devices between the word line segments, as shown in FIG. 3 of the '844 application.

A shared vertical connection preferably connects the word line segments together and connects to a word line driver circuit disposed generally below the array near the word line. Each word line driver circuit preferably couples its word line either to an associated one of a plurality of selected bias lines or to an unselected bias line associated with the driver circuit, which selected bias lines are themselves decoded to provide for an efficient multi-headed word line decoder as shown in FIG. 9 of the '844 application.

Still other space-saving techniques that can profitably be used to further reduce required substrate area for connections to support circuitry are described in the related Scheuerlein application recited in the first paragraph of the present application and filed on even date herewith.

This application teaches a via and staggered routing level structure. Vertically overlapping vias connect to two or more routing levels formed at different heights. The routing levels are either both formed above or both formed below the vias, and all are formed above a semiconductor substrate wafer.

In this way vias can be formed having a pitch smaller than the pitch of either the first routing level or the second routing level, saving space. An illustrative embodiment that could advantageously be used in the present invention is shown in FIG. 3 of Ser. No. 10/728,451, the Scheuerlein application filed on Dec. 5, 2003.

If required substrate area can be decreased using these space-saving techniques, relaxing pitch in the substrate to save photolithography costs becomes more advantageous.

The discussion here has focused on electrical connection to memory arrays. It will be understood, however, that this discussion is not intended to be limiting. Clearly the advantages of the present invention could provide benefit to other kinds of arrays, for example logic arrays, while the results still fall within the scope of the invention.

It was explained that support circuitry, like decoders and drivers, require extensive interconnectivity to the memory array, limiting its practical placement to the area immediately surrounding the memory array. Some circuitry formed in the substrate, however, doesn't require connections to conductors within the memory array, and thus can be placed under the memory array. Such circuitry might be a charge pump, for example, or supplemental volatile or nonvolatile memory. If adequate space remains under the array to form these circuits at larger pitch than the memory array, the decrease in fabrication cost is pure economic gain.

Ultimately the decision whether or not to relax pitch in a substrate device level relative to an above-substrate device level is typically based on cost. Use of the space-saving arrangements described herein decrease the substrate area of the memory array and its support circuitry, and thus the overall cost.

The foregoing detailed description has described only a few of the many forms that this invention can take. For this reason, this detailed description is intended by way of illustration, and not by way of limitation. It is only the following claims, including all equivalents, which are intended to define the scope of this invention.

The invention claimed is:

1. A semiconductor die comprising:
   a substrate device level having a substrate pitch, wherein the substrate pitch comprises a substrate critical dimension and is a sum of a line feature and space feature formed at the substrate device level; and
   a first memory level above a substrate having a first memory pitch, wherein the first memory pitch comprises a first memory critical dimension and is a sum of a line feature and space feature formed at the first memory level and wherein the first memory pitch is smaller than the substrate pitch,
   wherein the first memory level does not include a device at least a portion of which is formed by part of the substrate or located in or below a surface of the substrate, and wherein the first memory level comprises:
      a first area comprising portions of a first plurality of memory cells, the first plurality of memory cells having the first memory pitch; and
      a second area having a fan-out pitch, wherein said fan-out pitch is larger than the first memory pitch.

2. The semiconductor die of claim 1 wherein the substrate device level comprises driver circuitry.

3. The semiconductor die of claim 1 further comprising a second memory level above the first memory level, the second memory level having a second memory pitch, wherein the second memory pitch is smaller than the substrate pitch.

4. The semiconductor die of claim 1 wherein the first memory level comprises a plurality of substantially parallel, substantially coplanar rails.

5. The semiconductor die of claim 4 wherein the plurality of rails comprises a first plurality of memory lines electrically connected to a first plurality of vertical interconnects at a first end and a second plurality of memory lines electrically connected to a second plurality of vertical interconnects at a second end opposite the first end, the first and second pluralities of memory lines being interleaved.

6. A monolithic three dimensional memory array comprising:
    a substrate device level comprising devices formed in a substrate having a first pitch, wherein the first pitch comprises a substrate critical dimension and is a sum of a line feature and space feature formed at the substrate device level; and
    a first memory level formed over the substrate device level having a second pitch, wherein the second pitch comprises a first memory critical dimension and is a sum of a line feature and space feature formed at the first memory level and wherein the second pitch is smaller than the first pitch,
    wherein the first memory level does not include a device at least a portion of which is formed by part of the substrate or located in or below a surface of the substrate, and wherein the first memory level comprises:
        a first area comprising portions of a first plurality of memory cells, the first plurality of memory cells having the second pitch; and
        a second area having a fan-out pitch, wherein said fan-out pitch is larger than the second pitch.

7. The monolithic three dimensional memory array of claim 6 further comprising a second memory level formed over the first memory level, the second memory level having a third pitch, wherein the third pitch is smaller than the first pitch.

8. The monolithic three dimensional memory array of claim 7 wherein the first memory level comprises a plurality of substantially parallel, substantially coplanar semiconductor rails.

9. The monolithic three dimensional memory array of claim 6 wherein the first plurality of memory cells are passive element memory cells.

10. The monolithic three dimensional memory array of claim 6 wherein the first plurality of memory cells are antifuse-diode cells.

11. The monolithic three dimensional memory array of claim 6 wherein the first plurality of memory cells are thin film transistors having a charge-storage dielectric.

12. The monolithic three dimensional memory array of claim 6 wherein the first plurality of memory cells are arranged in series-connected NAND strings.

13. The monolithic three dimensional memory array of claim 6 further comprising segmented bit lines and global bit lines, wherein two segmented bit lines share a vertical connection to an associated global bit line.

14. The monolithic three dimensional memory array of claim 6 further comprising word line segments and a word line driver circuit in the substrate.

15. A semiconductor die comprising:
    a first device level formed in a substrate, the first device level having a first pitch, wherein the first pitch comprises a substrate critical dimension and is a sum of a line feature and space feature formed at the first device level; and
    a first plurality of substantially parallel, substantially coplanar rails formed above the substrate, the first plurality of rails having a second pitch, wherein the second pitch comprises a rail critical dimension and is a sum of a line feature and space feature of the first plurality of rails and wherein the first pitch is larger than the second pitch,
    wherein the first plurality of substantially parallel, substantially coplanar rails comprises:
        a first area comprising portions of a first plurality of memory cells, the first plurality of memory cells having the second pitch; and
        a second area having a fan-out pitch, wherein said fan-out pitch is larger than the second pitch.

16. The semiconductor die of claim 15 wherein the first device level comprises CMOS circuitry.

17. The semiconductor die of claim 16 wherein portions of the rails form diode portions.

18. The semiconductor die of claim 17 wherein portions of the rails form gate electrodes.

19. The semiconductor die of claim 17 wherein portions of the rails form transistor bodies.

20. The semiconductor die of claim 15 wherein the first plurality of rails comprises a first plurality of memory lines electrically connected to a first plurality of vertical interconnects at a first end and a second plurality of memory lines electrically connected to a second plurality of vertical interconnects at a second end opposite the first end, the first and second pluralities of memory lines being interleaved.

* * * * *